(12) United States Patent
Geurts et al.

(10) Patent No.: US 10,614,998 B2
(45) Date of Patent: Apr. 7, 2020

(54) CHARGE REDUCTION BY DIGITAL IMAGE CORRELATION

(71) Applicant: FEI Company, Hillsboro, OR (US)

(72) Inventors: Remco Geurts, Eindhoven (NL); Pavel Potocek, Eindhoven (NL); Brad Larson, Portland, OR (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 15/974,574

(22) Filed: May 8, 2018

(65) Prior Publication Data

US 2019/0348256 A1    Nov. 14, 2019

(51) Int. Cl.
*H01J 37/20* (2006.01)
*H01J 37/26* (2006.01)
*H01J 37/28* (2006.01)
*G06T 5/50* (2006.01)
*G06T 7/11* (2017.01)

(52) U.S. Cl.
CPC .............. *H01J 37/261* (2013.01); *G06T 5/50* (2013.01); *G06T 7/11* (2017.01); *G06T 2207/10061* (2013.01); *G06T 2207/20224* (2013.01); *H01J 2237/24507* (2013.01); *H01J 2237/2806* (2013.01)

(58) Field of Classification Search
CPC ........... H01J 37/261; H01J 2237/24507; H01J 2237/2806; G06T 7/11; G06T 5/50; G06T 2207/10061; G06T 2207/20224
USPC .......................... 250/306, 307, 309, 310, 311
See application file for complete search history.

(56) References Cited

U.S. PATENT DOCUMENTS

2014/0092231 A1*   4/2014   Nakahira .............. H01J 37/244
                                                                  348/80
2018/0374674 A1*   12/2018  Itai ........................ H01J 37/147

OTHER PUBLICATIONS

Fleet et al., "Optical Flow Estimation," *Mathematical Models in Computer Vision: The Handbook*, Chapter 15, pp. 239-258 (2005).

* cited by examiner

*Primary Examiner* — Nicole M Ippolito
(74) *Attorney, Agent, or Firm* — Klarquist Sparkman, LLP

(57) ABSTRACT

Charging areas in electron microscopy are identified by comparing images obtained in different frames. A difference image or one or more optical flow parameters can be used for the comparison. If charging is detected, electron dose is adjusted, typically just in specimen areas associated with charging. Dose is conveniently adjusted by adjusting electron beam dwell time. Upon adjustment, a final image is obtained, with charging effects eliminated or reduced.

26 Claims, 7 Drawing Sheets

CHARGE REDUCTION BY DIGITAL IMAGE CORRELATION

FIELD

The disclosure pertains to electron microscopy.

BACKGROUND

Scanning electron microscopes (SEM) are used in many applications in the evaluation of electronic, biological, and other types of samples. In SEM, a scanned electron beam interacts with a specimen to generate signals based on reflected, scattered, or transmitted electrons that can be used to produce specimen images. High-resolution images require scanning at many different specimen locations, and image acquisition can be slow. In some cases, specimens acquire charge upon exposure to the scanned electron beam, reducing image quality. While SEM operators can adjust scan times and beam currents to avoid specimen charging, such adjustments are subjective, slow, and require a skilled operator. In some cases, SEM operators evaluate images at selected areas at low resolution, and then adjust beam currents and dwell times accordingly. Unfortunately, these settings frequently do not produce the desired image quality. Accordingly, alternative methods and apparatus are needed to reduce charging effects in charged particle beam imaging.

SUMMARY

According to representative examples, charged particle beam (CPB) imaging systems include a scannable CPB source configured to scan a CPB at a specimen and a CPB detector situated to receive charged particles from the specimen in response to the scanned CPB. A system controller is coupled to the CPB source and the CPB detector to produce at least a first specimen image and a second specimen image based on the charged particles received by the CPB detector in response to the scanned CPB and compare the first specimen image and the second specimen image. Based on the comparison, at least one specimen region associated with specimen charging is identified and a CPB dwell time or a CPB current is determined for the at least one selected specimen region to reduce specimen charging. In other examples, the system controller is coupled to the scannable CPB source to direct the CPB to scan the at least one selected specimen region with the determined CPB dwell time or the determined CPB current. In further examples, the system controller is coupled to the scannable CPB source to direct the CPB to scan the at least one selected specimen region with the determined CPB dwell time. In other examples, the system controller is coupled to the scannable CPB source to direct the CPB to scan the at least one selected specimen region with the determined CPB current. According to other embodiments, the comparison of the first image and the second image is a difference, and the at least one specimen region is selected based on a magnitude of the difference between the first image and the second image. In alternative examples, the comparison of the first image and the second image is a difference, and the at least one specimen region is selected based on a sign of the difference between the first image and the second image. According to representative examples, the comparison of the first image and the second image is a difference image, and the at least one specimen region is selected based on a magnitude of the difference image associated with the at least one specimen region. In typical examples, the comparison is based on at least one displacement between the first image and the second image. In further embodiments, the at least one displacement between the first image and the second image is associated with at least one image pixel. In other alternatives, the comparison comprises at least one of an image shift or an apparent specimen velocity component associated with the first image and the second image.

CPB imaging methods comprise obtaining at least a first partial image and a second partial image of a stationary specimen with initial dwell times and CPB currents for a plurality of specimen locations. At least the first partial image and the second partial image are compared to identify specimen locations associated with specimen charging. Based on the comparison, for at least one identified specimen location, at least one of an alternative dwell time or an alternative beam current is selected. An adjusted specimen image is obtained based on at least one of the alternative dwell time and the alternative beam current. In some examples, the final image is a partial image. In typical examples, the first partial image and the second partial image are associated with adjacent image frames and the comparison the first partial image and the second partial image is a portion of a partial difference image associated with the first partial image and the second partial image. In some examples, the comparison is based on a magnitude or sign of a displacement or velocity determined for at least one pixel. In some alternatives, for the at least one identified specimen location, an alternative dwell time is selected based on the comparison.

Electron or ion beam imaging systems comprise a scannable electron or ion beam source that produce a scanned electron beam or a scanned ion beam, respectively. A charged particle detector is situated to receive charged particles from a specimen in response to irradiation of the specimen with the scanned electron beam or the scanned ion beam. A controller is coupled to scan the scannable electron beam or ion beam to obtain and store at least a first test image and a second test image based on the charged particles received by the charged particle detector in response to irradiation of the specimen with an initial dose. The controller further processes the first and second test images to identify charging areas on the specimen and adjust dose associated with at least one identified charging area. The controller is further configured to scan the scannable electron beam or ion beam to obtain an image based on the charged particles received by the charged particle detector in response to irradiation of the specimen with the adjusted dose in the identified charging areas. In additional embodiments, the received charged particles are secondary electrons, and the first and second test images have a first resolution and the image based on the adjusted dose has a second resolution, wherein the second resolution is greater than the first resolution. In other representative examples, the first and second test images are processed to identify the charging areas on the specimen based on a difference image or based on an apparent displacement or apparent speed.

In some examples, tangible computer readable media include processor-executable instructions for performing any of the above methods or any combination of the associated method steps, or are included in an imaging system controller.

The foregoing and other objects, features, and advantages of the disclosed technology will become more apparent from the following detailed description, which proceeds with reference to the accompanying figures.

DETAILED DESCRIPTION

Figure 1:
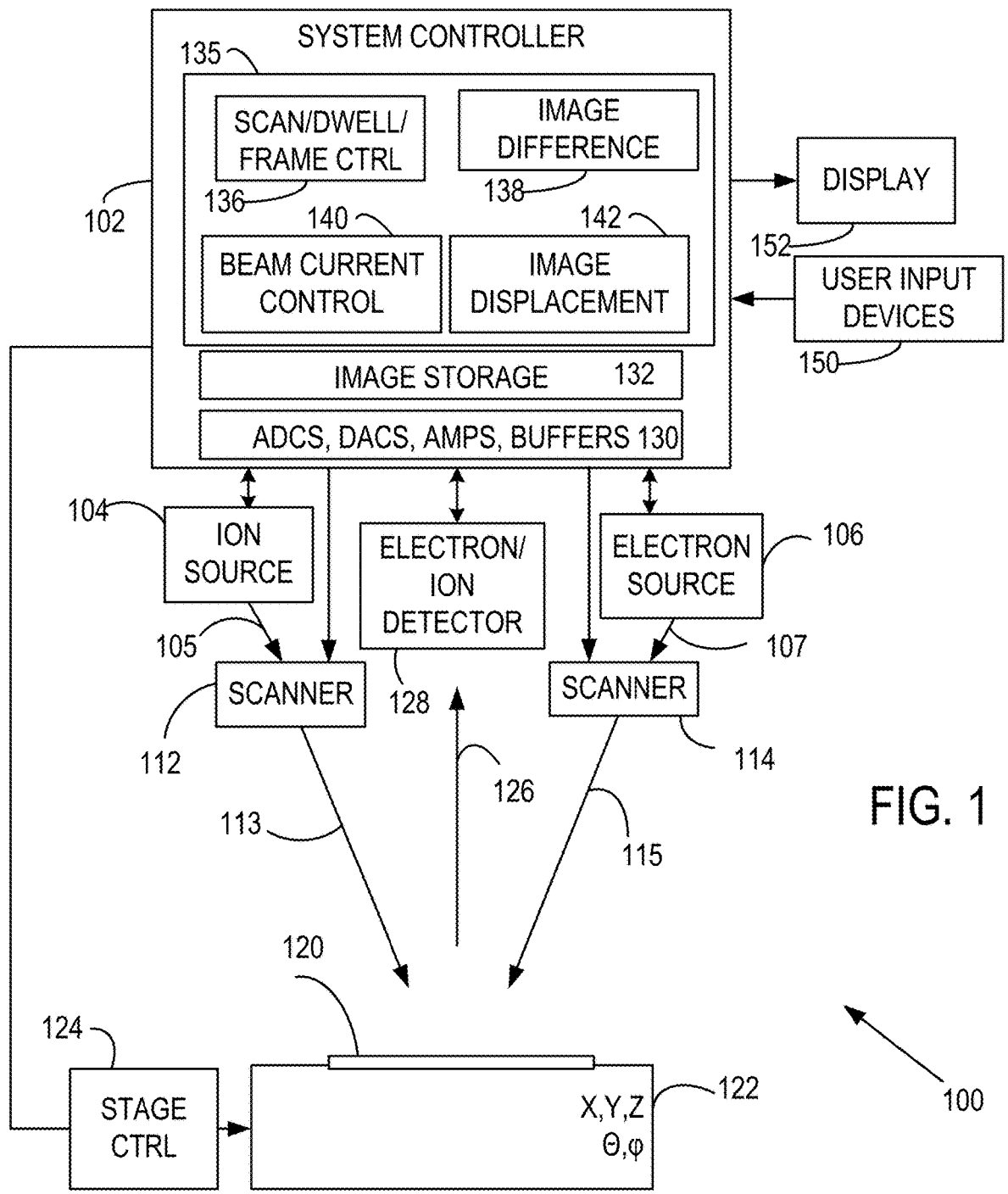
FIG. 1 illustrates a representative CPB imaging system that adjusts dose based on specimen charging.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items. The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections.

Examples are described with reference to directions indicated as "above," "below," "upper," "lower," and the like. These terms are used for convenient description, but do not imply any particular spatial orientation.

Some examples are described with reference to Scanning Electron Microscopes (SEMs), but other charged particle beam (CPB) imaging systems can be used such as ion beam systems. As used herein, the term "image" refers to a visual depiction of a sample suitable for observation by a user as well as a set of digital or analog data that is stored or can be stored for producing visual images. Such data can be stored as xy data arrays, JPEG files, TIFF files, bit maps, or other formats. Image series can be similarly stored using these formats or stored and processed as video files such as MPEG files. Images are generally referred to as including a two dimensional array of image values such as intensities (collected current/charge), image differences (magnitudes or signs), apparent displacements in one or more directions, displacement magnitudes, or apparent velocities (magnitudes, directions, velocity component(s)). In some cases, a complete image is acquired based on an available specimen field of view, but in other cases, only portions of a field of view are scanned and recorded. For example, selected features of interest can be imaged to determine if charging is occurring in a particular portion of a specimen.

Typically, CPB images are obtained sequentially at a rate referred to herein as a frame rate. The frame rate can be fixed, variable, selected to obtain a preferred signal-to-noise ratio, to provide rapid specimen scans to identify specimen areas for more detailed investigation, to note susceptibility to charging artifacts, or to avoid CPB damage to a specimen area. Similarly, it is general convenient to produce a specimen image by scanning over a fixed number of specimen regions to produce images having a corresponding fixed number of pixels, wherein each pixel has an associated image intensity value (I) and a two-dimensional image location (x,y). In some cases, a single spatial dimension can be used, and may or may not be along a coordinate axis, or even along a straight line or a single line segment. Scanning can thus be along lines or curves, and need not be along a fixed raster pattern. In some examples, spatial coordinates (x,y) refer to specimen locations instead of image locations. In most imaging applications, image and specimen coordinates are related by an image magnification which can include an image inversion.

For convenient description, images are typically referred to as a first image and a second image. These images need not be obtained sequentially, and the first image need not be acquired prior to the second image. CPB images can be provided by combining CPB images from two or more frames by, for example, averaging or otherwise merging images from multiple frames. In addition, CPB images can be processed to exclude regions that exhibit charging or other image changes, and images from one or more frames and obtained under different acquisition conditions can be used for areas associated with charging or other image changes.

CPB dose at any particular specimen location is proportional to CPB beam current and CPB dwell time at the location, and image signal-to-noise ratio can depend on dose. Varying dwell time is generally more convenient that varying beam current, and images can be obtained with constant or variable dose. As discussed below, dose can be varied within an image acquisition from location to location to reduce or mitigate the effects of specimen charging or to avoid sample damage. In typical examples, the effects of sample charging are reduced to provide superior images, but the methods and apparatus disclosed herein can also be used to detect specimen changes such as melting, thermal expansion, or changes in response to CPB exposure or other changes.

Other scan parameters can be varied as well to reduce (or increase) effects of scanning on a specimen or a resulting image. For example, one or more of scan resolution, scan type such as interlaced or non-interlaced scan, or sparsified scanning (i.e., scans that include only selected pixels) can be selected. Acquisition conditions such as frame rate or number of frames to be averaged or otherwise combined can be selected. In some cases, images associated with such scan parameters or acquisition conditions are evaluated to identify specimen/image changes, and then adjusted. Selected images areas (such as areas associated with charging or other changes) can be excluded from some acquisition conditions and included in others. For example, image portions or images associated with excluded areas or other areas can use different dwell times, beam currents, resolutions, numbers of averages, or frame rates. In some examples, full field images are obtained, while in others, only selected portions are obtained. As used herein, partial image refers to a full field image or a portion thereof.

Many practical examples of the disclosed technology pertain to SEM imaging in which an electron beam is directed to a sample. In response to such scanning, images can be formed based on backscattered electrons from the electron beam, based on secondary electrons emitted in response to the scanned beam, or both. In other examples, ion beams are focused and scanned, and secondary ions, neutral atoms, or second electrons can be collected to form images. Focused ion beams tend to produce specimen changes, and a threshold for detection of specimen charging may need to be higher than in electron beam imagery to compensation for beam induced changes. The image comparisons described below can also be used generally to confirm that a specimen remains unchanged during any particular evaluation.

In most examples, a CPB specimen under investigation is fixed. However, according to some methods described below, apparent image displacements, speeds, and velocities are determined based on image pairs. These are generally noted as "apparent" to emphasize that the specimen does not move.

Referring to FIG. 1, an imaging system 100 includes a system controller 102 that is coupled to an ion beam source 104, an electron beam source 106 that produce an ion beam 105 and an electron beam 107, respectively. Respective scanners 112, 114 are situated to direct a scanned ion beam 113 and a scanned electron beam 115, respectively, with respect to a specimen 120. In some application, images are obtained based on the scanned electron beam 115, and the scanned ion beam 113 is used for specimen modification. However, images can be obtained with either one or both of the scanned ion beam 113 and the scanned electron beam 115. In some cases, an imaging system includes only one of an electron beam source and an ion beam source.

The specimen 120 is secured to a stage 122 that is coupled to a stage controller 124 that is in turn coupled to the system controller 102. The stage 122 generally can provide one or more translations, rotations, or tilts as directed by the system controller 102. A beam 126 responsive to the scanned ion beam 113 or the scanned electron beam 115 is directed to an electron or ion detector 128 which is coupled to system electronics 130 which can include one or more analog-to-digital convertors (ADCs), digital to analog-convertors (DACs), amplifiers, and buffers for control of the detector 128 and processing (amplification, digitization, buffering) of signals associated with the detector 128. In other examples, a photon detector is used that produces an electrical signal that is further processed by the system electronics. In most practical examples, at least one ADC is used to produce a digitized detector signal that can be stored in one or more tangible computer readable media (shown as image storage 132) as an image. In other examples, image storage is remote via a communication connection such as a wired or wireless network connection. The beam 126 can be scattered portions of the scanned ion beam 113, the scanned electron beam 115, secondary electrons, ions, or neutral atoms.

The system controller 102 is coupled to a memory 135 that stores processor-executable instructions for image processing and charging compensation using differences and optical flow in respective memory portions 138, 142. The system controller 102 establishes image acquisition parameters such as frame rate and beam dwell/scan times, scan paths, beam current using processor-executable instructions stored in memory portions 136, 140. Specimen images, image differences (such as difference magnitudes and/or difference vectors), image flow parameters and other images can be presented on a display 152, and system control and imaging parameters can be specified using internally stored values from the memory 135, or provided by a user with one or more user input devices 150. System control hardware and image acquisition and processing methods are discussed in detail below.

Figure 2:
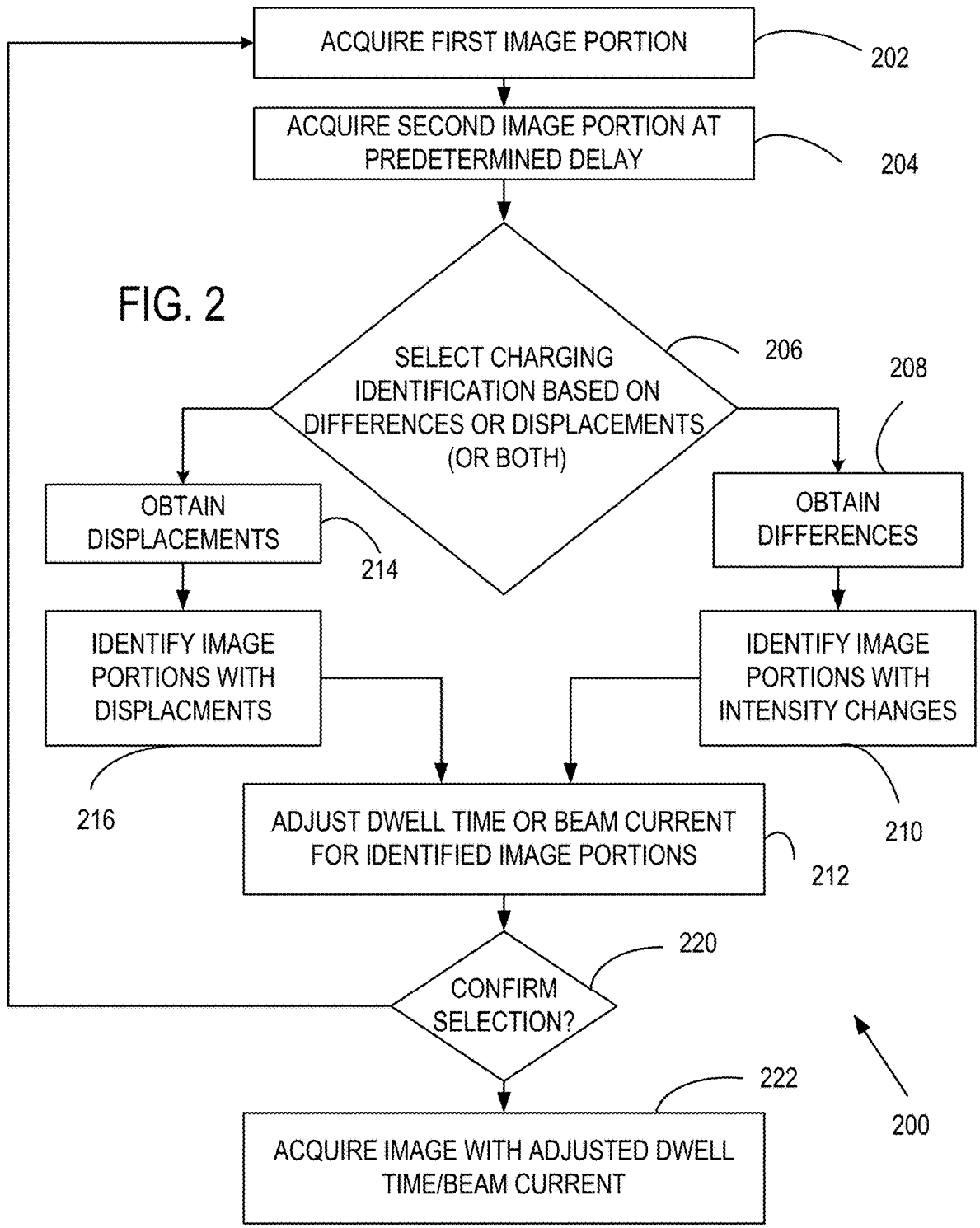
FIG. 2 is a block diagram illustrating selection of comparisons for determining dose adjustments.

Specimen areas associated with accumulation of charge (and reduced CPB image quality) can be identified and imaging parameters modified to avoid or reduce these effects. FIG. 2 illustrates a representative method 200 that includes obtaining at least a portion of a first image of a substrate at 202. At 204, a second image (or image portion) of the specimen corresponding to the same specimen area is obtained after a predetermined delay, generally as specified by a frame rate. At 206, one or more methods of processing the first image and the second image to identify charging is selected. As shown, at 208, image differences between the first image and the second image (or one or more portions of these images) are determined. At 210, image areas associated with charging are identified using the image differences. For example, specimen areas that do not exhibit charging effects tend to produce the same image intensities in each scan, while image intensities can vary frame-to-frame where charging occurs. Thus, image intensity differences $\Delta(x, y)=I(x, y, t_1)-I(x, y, t_2)$ between images acquired at times $t_1$, $t_2$ tend to have smaller magnitudes at non-charging areas and larger magnitudes at areas that charge. At 212, CPB dwell time or current is adjusted to reduce charging at one or more of the identified areas. If preferred, verification that the adjusted values sufficiently reduce or eliminate charging can be selected at 220, and first and second images are selected again at 202, 204.

Alternatively, at 206, image comparison based on apparent displacements (or apparent velocities) can be selected. At 214, apparent displacements are determined and at 216 image portions are identified based on the displacements, such as by comparing displacement magnitudes with a threshold value. At 212, image acquisition parameters such as frame rate, dwell time, and bean currents can be altered for the identified specimen areas. Verification that the adjusted values sufficiently reduce or eliminate charging artifacts can be selected at 220. If no verification is selected, images are acquired with the altered parameters at 222.

Optical Flow

One approach to the identification of charging areas is based on image processing referred to as "optical flow." In optical flow, image motion is estimated as image velocities or image displacements. In application to charging areas, specimen and image sensor positions generally do not change, but optical flow calculations produce estimates of apparent image velocities and displacement based on the following:

$$I(x+\Delta x, y+\Delta y, t+\Delta t) = I(x, y, t) + \frac{\partial I}{\partial x}\Delta x + \frac{\partial I}{\partial y}\Delta y + \frac{\partial I}{\partial t}\Delta t,$$

which can be simplified to $$\frac{\partial I}{\partial x}V_x + \frac{\partial I}{\partial y}V_y + \frac{\partial I}{\partial t} = 0,$$

wherein $$V_x = \frac{dx}{dt} \text{ and } V_y = \frac{dy}{dt}$$

are the x-component and y-components of apparent velocity (or flow) of the image intensity l(x, y, t), wherein x, y are image/specimen coordinates (typically along orthogonal axes) and t is time. The apparent velocity components ($V_x$, $V_y$) can be calculated in a variety of ways such as the Lucas-Kanade method, the Horn-Schunck method, the Buxton-Buxton method, the Black-Jepson method among others. The apparent velocity components are also associated with and proportional to corresponding image displacements. For example, for images acquired in adjacent frames at a frame rate $f_{FRAME}$ (or time between frames $1/f_{FRAME}$), an apparent velocity component V corresponds to an apparent displacement $V/f_{FRAME}$. As used herein, optical flow refers to an apparent speed, one or more apparent velocity components, one or more apparent displacements, or a displacement magnitude obtained based on differences in a first image and a second image. In typical examples, the first image and the second image are obtained in adjacent frames. Use of adjacent frames is typically associated with more rapid image acquisition in which charging effects are more apparent. SEM image portions which exhibit charging typically produce variable image intensities, and these variable image intensities are associated with larger optical flow values (velocity components $V_x$, $V_y$, or displacement components $D_x=V_x/f_{FRAME}$, $D_y=V_y/f_{FRAME}$) While two velocity components (or two displacement components) can be used, a single component of either apparent velocity or apparent displacement, a magnitude of either component, or a magnitude of speed such as $V=\sqrt{V_x^2+V_y^2}$ or a magnitude of total apparent displacement $\sqrt{D_x^2+D_y^2}$, or other functions of apparent velocity or apparent displacement are generally sufficient. SEM images of areas associated with specimen charging tend to show larger values of one or both of apparent velocity or displacement.

Figure 3:
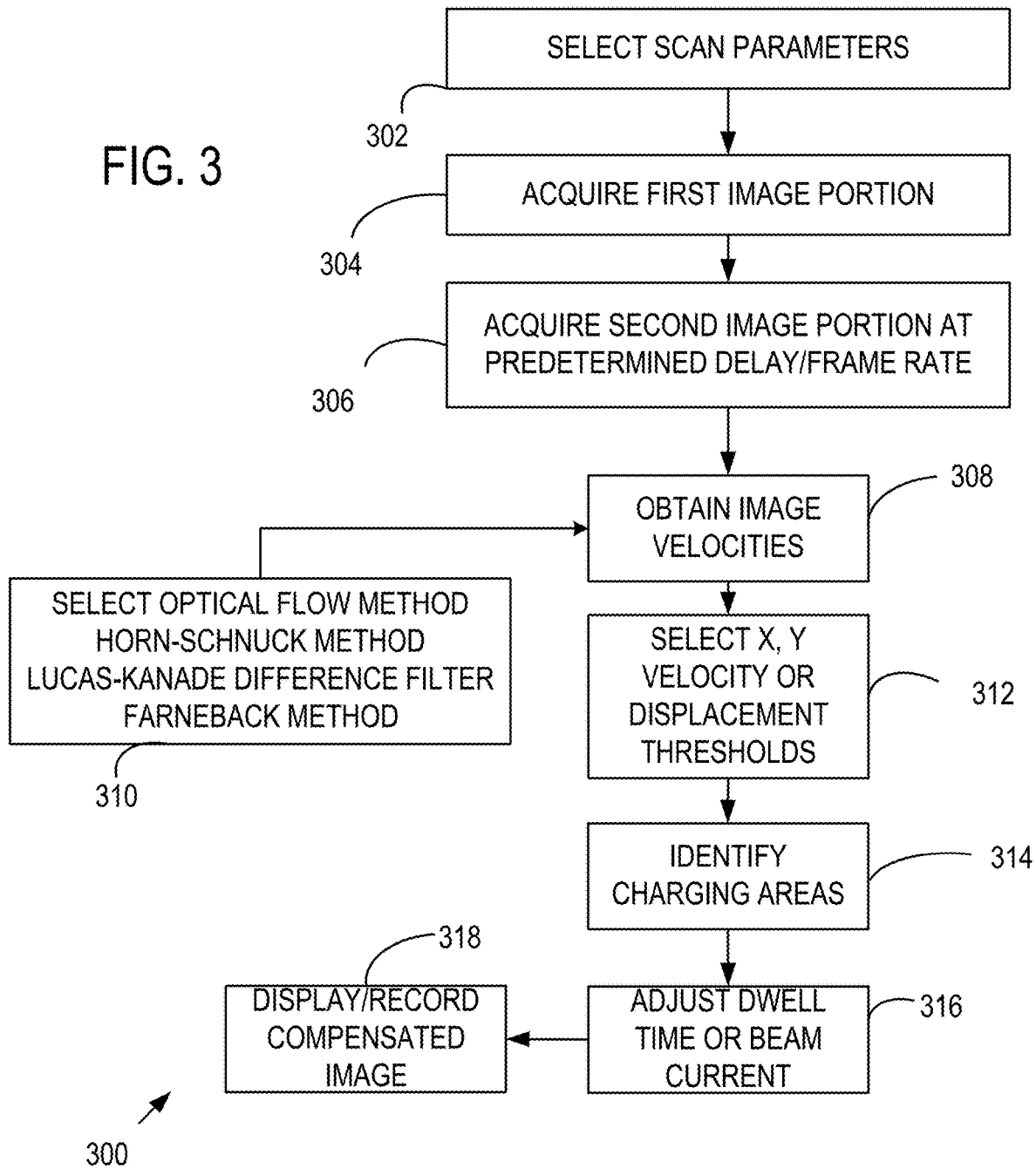
FIG. 3 is a block diagram illustrating dose adjustment using apparent velocities or apparent displacements associated with optical flow.

With reference to FIG. 3, a method 300 includes selecting scan parameters at 302 and acquiring first and second images at 304, 306. At 308, image velocities are obtained using one or more optical flow methods selected at 310. At 312, one or more apparent displacement or apparent velocity thresholds are selected for x-components, y-components, and/or magnitudes of apparent velocity or apparent displacement. At 314, charging areas are identified based on comparison with one or more threshold values, and at 316 image acquisitions parameters such as dwell time and/or beam current are adjusted. At 318, a compensated image is acquired.

Image Differences

Figure 4:
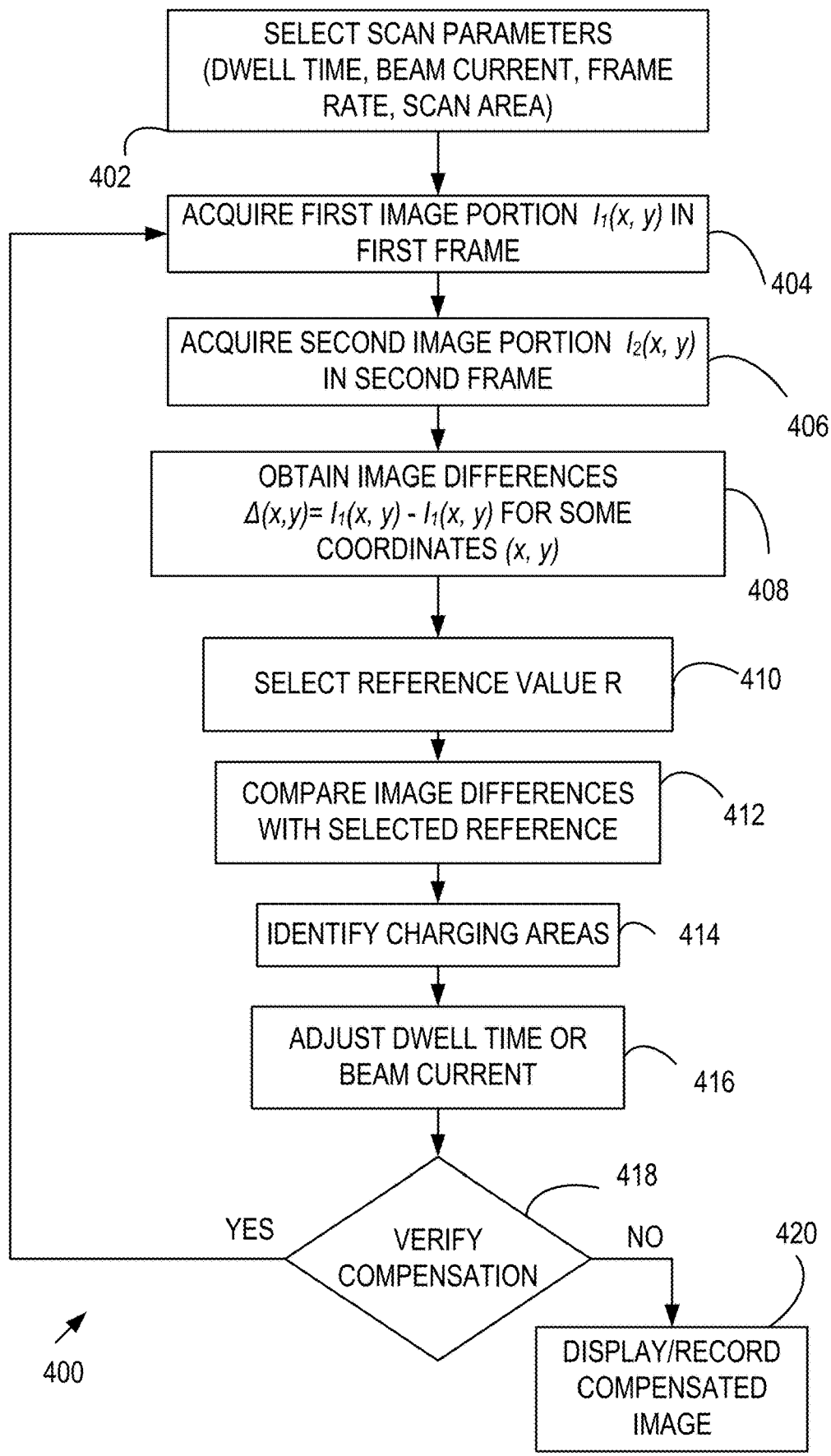
FIG. 4 is a block diagram illustrating dose adjustment based on image differences.

In some cases, image differences can be used to identify specimen areas associated with specimen charging. Referring to FIG. 4, a method 400 includes selecting scan parameters such as dwell times, scan rate, beam current, frame rate, image size, scan area at 402. At 404, an intensity image I(x, y, $t_1$) in a first frame is acquired and at 406, an intensity image I(x, y, $t_2$) in a second frame is acquired. At 408, image differences are obtained for at least some image coordinates (x, y). At 410, a reference value R is selected for comparison, and at 412, the image differences are compared based on the reference value R, and charging areas identified at 414. For example, for selected image coordinates it is determined if |I(x, y, $t_1$)−I(x, y, $t_2$)|>R; if so, such coordinates are associated with image locations at which charging occurred in image acquisition. Alternatively, image coordinates associated with I(x, y, $t_1$)−I(x, y, $t_2$)>0 or <0 can be identified, typically within some margin to avoid noise in intensity values. At 416, beam current and/or dwell time are adjusted for specimen areas corresponding to identified image locations. At 418, the method can return to 404 to verify sufficient compensation. Otherwise, at 420, a compensated image is acquired and typically displayed based on the adjusted beam current and/or dwell time (i.e., dose). In some cases, dose is increased at some image locations until image charging is detected so that image acquisition can use large doses to obtain enhanced signal-to-noise ratios.

Figures 5A, 5B, 5C, 5D:
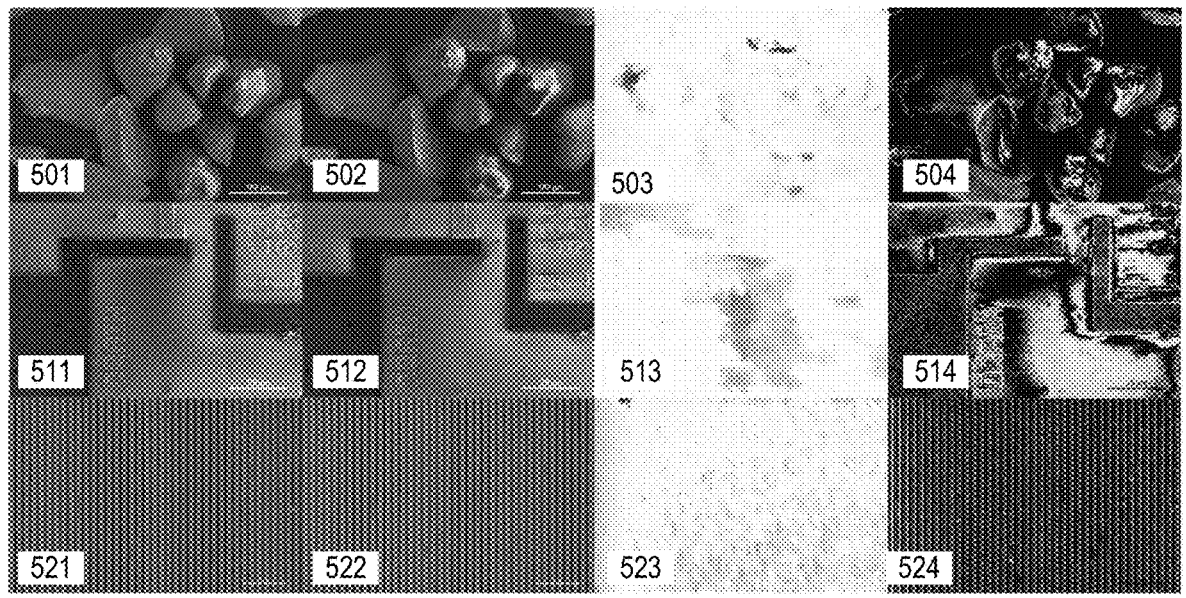
FIGS. 5A-5B are specimen images of three different specimens.
FIGS. 5C-5D are optical flow images and difference images, respectively, based on the specimen images of FIGS. 5A-5B.

FIGS. 5A-5D illustrate identification of charging areas. FIGS. 5A-5B show first images 501, 511, 521 and second images 502, 512, 522, respectively, of different specimens. FIG. 5C contains optical flow-based images 503, 513, 523 in which darker areas correspond to specimen areas exhibiting charging. Pseudo-color assignments can be used to designate areas with different optical flow velocities (either magnitudes, directions, or both). FIG. 5D contains images 504, 514, 524 based on image intensity differences. Lighter areas in these images are associated with specimen charging and similar lighter areas are generally visible in the first images 501, 511, 521 and the second images 502, 512, 522. As with FIG. 5C, pseudo-color assignments can be used to designate areas with different differences or differences within a particular range.

Figure 6:
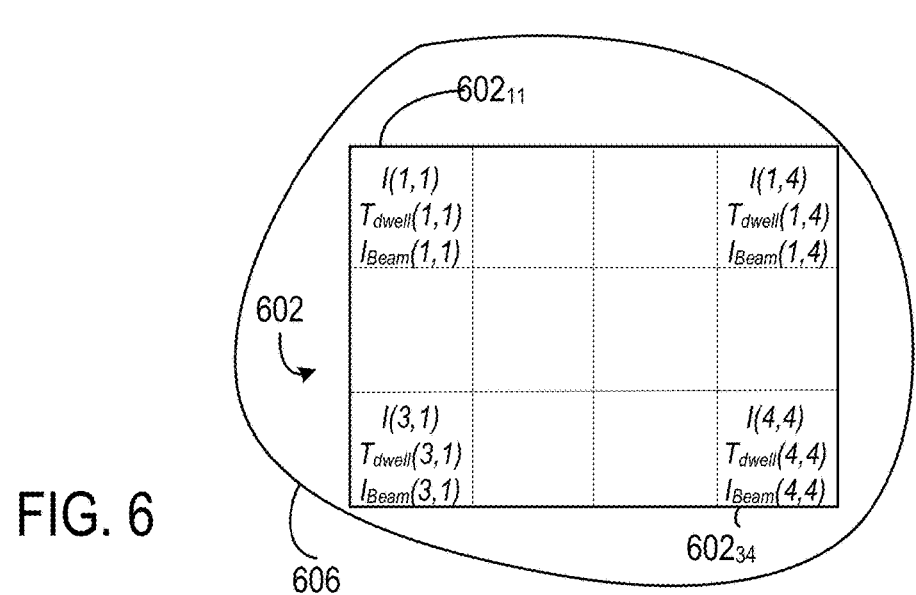
FIG. 6 illustrates mapping of image pixels to a specimen.

FIG. 6 illustrates mapping of a representative pixel array 602 that contains image pixels $602_{11}$ ... $602_{34}$ to a specimen 606. A 3 row by 4 column pixel array is shown for convenient illustration, and typically much larger arrays are used. Each pixel of the pixel array 602 is associated with an intensity I(i, j) obtained in response to CPB scanning, wherein i, j are integers that refer to pixel array rows and columns. In addition, for each pixel, a dose Dose(i, j)=$I_{Beam}$(i, j)*$T_{dwell}$(i, j), wherein $I_{Beam}$(i, j) is beam current and $T_{dwell}$(i, j) is beam dwell time at a pixel at coordinates i, j. Each can be independently selected as discussed above to avoid or reduce charging effects. The complete pixel array 602 need not be investigated for charging effects, and values for some or all pixels of the pixel array determined based on measurements of nearby pixels. For example, charge effects can be investigated using a low resolution (fewer pixels or larger pixels) for dose adjustment, following by image acquisition at a high resolution. In some cases, imaging of each new specimen or specimen location includes a scan to identify charging regions and adjustment of dwell time or beam current, followed by image acquisition. The initial scan can be at a lower resolution than a final image, and can include only a portion of a specimen to be imaged. In acquisition of a final image, charging regions are typically scanned more rapidly than other regions to avoid charging effects. However, the more rapid scan can result in reduced signal-to-noise ratio, and multiple scans of these regions may provide superior images. Increasing a frame rate to acquire multiple images of charging areas may reintroduce charging effects. To avoid these charging effects, the frame rate can be fixed, or, if frame rate is increased, image pairs can be processed to identify charging at the increased frame rate to determine suitable dose (typically lower dose). If the frame rate is reduced, charging effects tend to be reduced, and images can be processed to identify charging regions so that dose can be adjusted (increased) accordingly at the reduced frame rate.

The methods and apparatus discloses above permit full frame dwell time and beam current selection by selecting total dose to minimize, reduce, or otherwise control image charge effects. For any new specimen, or specimen location, two or more images are obtained and processed, and operator intervention is not required.

Figure 7:
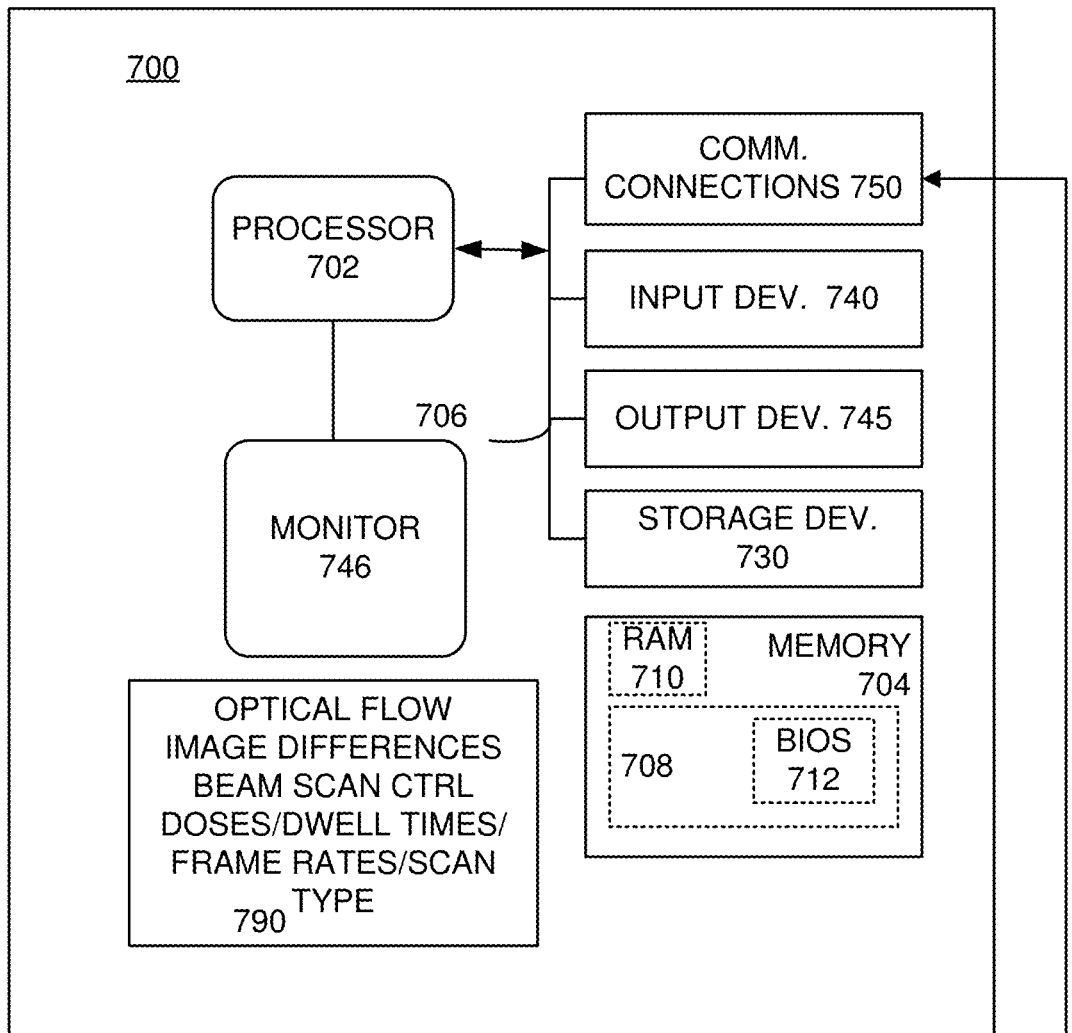
FIG. 7 illustrates a representative computing environment for control and computation in CPB imaging.
Figure 7:
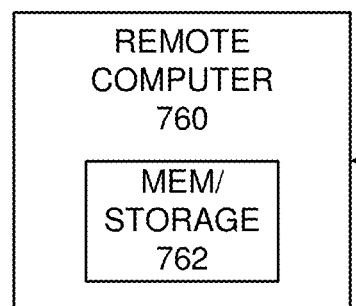

FIG. 7 and the following discussion are intended to provide a brief, general description of an exemplary computing environment in which the disclosed technology may be implemented. In particular, some or all portions of this computing environment can be used with the above methods and apparatus to, for example, control beam scanning, beam dose, and image processing to identify charging errors. Although not required, the disclosed technology is described in the general context of computer executable instructions, such as program modules, being executed by a personal computer (PC). Generally, program modules include routines, programs, objects, components, data structures, etc., that perform particular tasks or implement particular abstract data types. Moreover, the disclosed technology may be implemented with other computer system configurations, including hand held devices, tablets, multiprocessor systems, microprocessor-based or programmable consumer electronics, network PCs, minicomputers, mainframe computers, and the like. The disclosed technology may also be practiced in distributed computing environments where tasks are performed by remote processing devices that are linked through a communications network. In a distributed computing environment, program modules may be located in both local and remote memory storage devices.

With reference to FIG. 7, an exemplary system for implementing the disclosed technology includes a general purpose computing device in the form of an exemplary conventional PC 700, including one or more processing units 702, a system memory 704, and a system bus 706 that couples various system components including the system memory 704 to the one or more processing units 702. The system bus 706 may be any of several types of bus structures including a memory bus or memory controller, a peripheral bus, and a local bus using any of a variety of bus architectures. The exemplary system memory 704 includes read only memory (ROM) 708 and random access memory (RAM) 710. A basic input/output system (BIOS) 712, containing the basic routines that help with the transfer of information between elements within the PC 700, is stored in ROM 708.

The exemplary PC 700 further includes one or more storage devices 730 such as a hard disk drive for reading from and writing to a hard disk, a magnetic disk drive for reading from or writing to a removable magnetic disk, and an optical disk drive for reading from or writing to a removable optical disk (such as a CD-ROM or other optical media). Such storage devices can be connected to the system bus 706 by a hard disk drive interface, a magnetic disk drive interface, and an optical drive interface, respectively. The drives and their associated computer readable media provide nonvolatile storage of computer-readable instructions, data structures, program modules, and other data for the PC 700. Other types of computer-readable media which can store data that is accessible by a PC, such as magnetic cassettes, flash memory cards, digital video disks, CDs, DVDs, RAMs, ROMs, and the like, may also be used in the exemplary operating environment.

A number of program modules may be stored in the storage devices 730 including an operating system, one or more application programs, other program modules, and program data. A user may enter commands and information into the PC 700 through one or more input devices 740 such as a keyboard and a pointing device such as a mouse. For example, the user may enter commands to initiate image acquisition or select whether, for example, optical flow or image differences are to be used to locate charging regions. Other input devices may include a digital camera, microphone, joystick, game pad, satellite dish, scanner, or the like. These and other input devices are often connected to the one or more processing units 702 through a serial port interface that is coupled to the system bus 706, but may be connected by other interfaces such as a parallel port, game port, universal serial bus (USB), or wired or wireless network connection. A monitor 746 or other type of display device is also connected to the system bus 706 via an interface, such as a video adapter, and can display, for example, one or more test images used in identifying charging regions, final images, or processed images that show image differences, displacements, or velocities, including such images after a first adjustment of dose. Other peripheral output devices, such as speakers and printers (not shown), may be included.

The PC 700 may operate in a networked environment using logical connections to one or more remote computers, such as a remote computer 760. In some examples, one or more network or communication connections 750 are included. The remote computer 760 may be another PC, a server, a router, a network PC, or a peer device or other common network node, and typically includes many or all of the elements described above relative to the PC 700, although only a memory storage device 762 has been illustrated in FIG. 7. The personal computer 700 and/or the remote computer 760 can be connected to a logical a local area network (LAN) and a wide area network (WAN). Such networking environments are commonplace in offices, enterprise wide computer networks, intranets, and the Internet.

As shown in FIG. 7, a memory 790 (or portions of this or other memory) store processor executable instructions for image acquisition to establish dose, frame time, beam current, scan rate, and image processing using optical flow, image differences, or other image comparison to identify charging regions. In addition, the memory 790 includes processor executable instructions for setting threshold or comparison values, selecting one more velocity or displacement components, or difference sign or velocity or displacement direction for identifying charging regions. In some examples, processor-executable instructions produce displayed test images, optical flow or difference images, or trigger notifications of sample changes such as melting. In other examples, charging area dose adjustments are made without display of test images and without user intervention. Alternatively, images can be displayed such as comparison images for user selection of comparison method and to accept dose adjustments. While the methods and apparatus are generally described with reference to CPB imaging systems that detect charged particles produced in response to CPBs, or portions of CPB beams scattered or otherwise modulated by a specimen, CPB imaging systems can also detect optical signals emitted in response to a CPB to produce images. In either case, such charged particles or photons define a signal that can be used to form one or more images.

Figure 8:
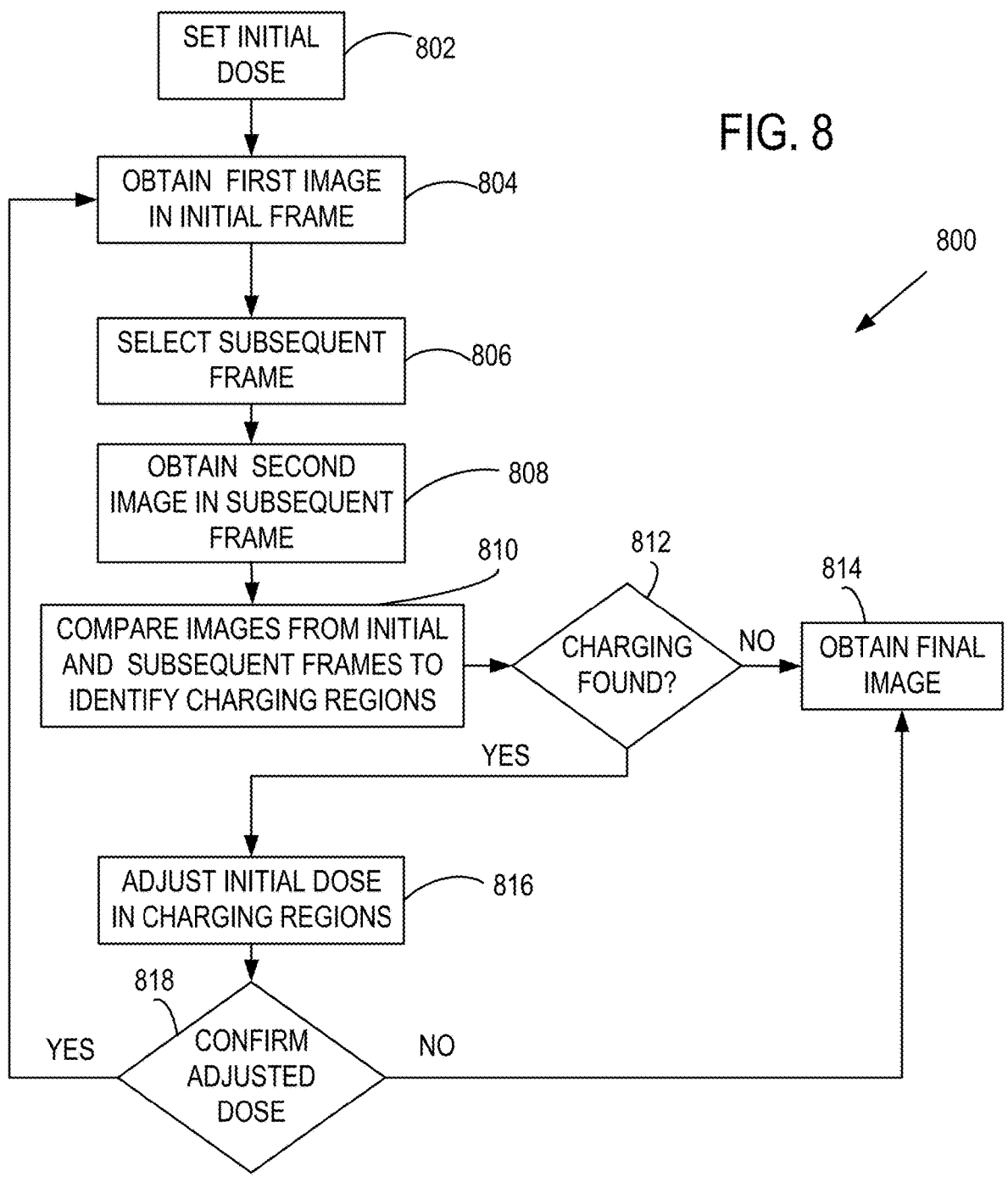
FIG. 8 illustrates a method of obtaining a CPB image exhibiting reduced specimen charging.

FIG. 8 illustrates a representative method 800 that includes setting initial doses for image acquisition at 802 and acquiring an associated first image in a first frame at 804. At 806, a subsequent frame is selected (typically the next frame), and a second imaging is acquired at the initial doses at 808. At 810, the images from the initial and subsequent frames are compared to identify charging regions. The comparison can be a numerical comparison using threshold values for image differences, or reference values associated with magnitudes, directions, or components of apparent velocity and/or displacement. Alternatively, comparison images such as difference images, apparent velocity or apparent displacement images, or other images that compare the initial image and the subsequent image can be displayed to permit a user to select charging areas. If charging areas are identified at 812, initial dose is adjusted in one or more charging regions at 816. If no charging areas are identified, a final image is obtained or displayed at 814. If there are no dose adjustments, either of the initial image or the subsequent image can be used as a final image.

After dose adjustment at 816, at 818 it is determined whether or not to confirm that the adjusted dose has suitably reduced charging effect. If confirmation is not desired, a final image can be obtained and displayed at 814 using the adjusted dose. If confirmation is intended, processing returns to image acquisition at 804. Initial and adjusted dose can be the same or different for all specimen areas, i.e., Dose=Dose (x,y) can be constant or variable. For example, a lower dose selected to avoid charging in some specimen areas can be used for many or all specimen areas.

In view of the many possible embodiments to which the principles of the disclosed technology may be applied, it should be recognized that the illustrated embodiments are only representative examples and should not be taken as limiting the scope of the disclosure. Alternatives specifically addressed in these sections are merely exemplary and do not constitute all possible alternatives to the embodiments described herein. For instance, various components of systems described herein may be combined in function and use. We therefore claim as our invention all that comes within the scope and spirit of the appended claims.

We claim:

1. A charged particle beam (CPB) imaging system, comprising:
 a scannable CPB source configured to scan a CPB at a specimen;
 a detector situated to produce a signal responsive to scanning the CPB on the specimen; and
 a system controller coupled to the CPB source and the detector so as to produce at least a first specimen image and a second specimen image based on the signals produced by the detector in response to the scanned CPB and compare the first specimen image and the second specimen image, and based on the comparison, select at least one specimen region associated with a CPB scan induced specimen change.

2. The CPB imaging system of claim 1, wherein the detector is a CPB detector situated to receive charged particles from the specimen in response to the scanned CPB and produce the signal in response to the received charged particles, and the system controller is coupled to the CPB source and the CPB detector to produce the first specimen image and the second specimen image based on the charged particles received by the CPB detector in response to the scanned CPB.

3. The CPB imaging system of claim 2, wherein the scan induced specimen change is specimen charging or specimen melting.

4. The CPB imaging system of claim 3, wherein the system controller determines a CPB dwell time or a CPB current for the at least one selected specimen region.

5. The CPB imaging system of claim 4, wherein the system controller is coupled to the scannable CPB source to direct the CPB to scan the at least one selected specimen region with the determined CPB dwell time or the determined CPB current.

6. The CPB imaging system of claim 4, wherein the system controller is coupled to the scannable CPB source to direct the CPB to scan the at least one selected specimen region with the determined CPB dwell time.

7. The CPB imaging system of claim 4, wherein the system controller is coupled to the scannable CPB source to direct the CPB to scan the at least one selected specimen region with the determined CPB current.

8. The CPB imaging system of claim 3, wherein the system controller determines a frame rate or a number of frames to be averaged for the at least one specimen region.

9. The CPB imaging system of claim 3, wherein at least one of the first specimen image and the second specimen image is obtained by combining a plurality of images acquired in a corresponding plurality of frames.

10. The CPB imaging system of claim 2, wherein the comparison of the first image and the second image is a difference vector, and the at least one specimen region is selected based on a magnitude or direction of the difference vector between the first image and the second image.

11. The CPB imaging system of claim 2, wherein the scan induced specimen change is specimen charging.

12. The CPB imaging system of claim 2, wherein the comparison of the first image and the second image is a difference image, and the at least one specimen region is selected based on a magnitude of the difference image associated with the at least one specimen region.

13. The CPB imaging system of claim 2, wherein the comparison is based on at least one displacement between the first image and the second image.

14. The CPB imaging system of claim 13, wherein the at least one displacement between the first image and the second image is associated with at least one image pixel.

15. The CPB imaging system of claim 2, wherein the comparison comprises at least one of an image shift or an apparent specimen velocity component associated with the first image and the second image.

16. The CPB imaging system of claim 2, wherein the at least one of the image shift or the apparent specimen velocity component is based on at least one pixel that is associated with charging.

17. A method, comprising:
 in a CPB imaging system that includes a scannable CPB source configured to scan a CPB at a specimen and a detector situated to produce a signal responsive to scanning the CPB on the specimen, obtaining at least a first image and a second image of a stationary specimen with initial acquisition conditions for a plurality of specimen locations based on signals produced by the detector in response to the scanned CPB;

comparing the first image and the second image to identify specimen locations associated with a CPB induced specimen change;

based on the comparison, for at least one identified specimen location, selecting at least one alternative acquisition condition; and obtaining a final specimen image based on the at least one alternative acquisition condition.

18. The method of claim 17, wherein the initial acquisition conditions are the same for each of the plurality of specimen locations, and the final image is a partial image.

19. The method of claim 17, wherein the CPB induced specimen change is specimen charging.

20. The method of claim 19, wherein the initial acquisition conditions include dwell times and CPB currents for the plurality of specimen locations, the comparing the first image and the second image identifies specimen locations associated with specimen charging, and based on the comparison, for the at least one identified specimen location, at least one of an alternative dwell time or an alternative beam current is selected to obtain the final specimen image.

21. The method of claim 20, wherein the initial dwell times and beam currents are the same for each of the plurality of specimen locations, and the final image is a partial image.

22. The method of claim 20, wherein the first image and the second image are associated with adjacent image frames.

23. The method of claim 20, wherein the comparison the first image and the second image is a portion of a partial difference image associated with the first image and the second image.

24. The method of claim 20, wherein the comparison is based on a magnitude or sign of a displacement or velocity determined for at least one pixel.

25. The method of claim 20, wherein based on the comparison, an alternative dwell time is selected for the at least one identified specimen location.

26. The method of claim 17, wherein the at least one alternative acquisition condition includes one or more of beam current, dwell time, frame rate, image size, image averages, or CPB scan type.

* * * * *